United States Patent [19]

Rosen et al.

[11] 4,237,600
[45] Dec. 9, 1980

[54] METHOD FOR FABRICATING STACKED SEMICONDUCTOR DIODES FOR HIGH POWER/LOW LOSS APPLICATIONS

[75] Inventors: Arye Rosen, Cherry Hill; Anna M. Gombar, Princeton; Edward Mykietyn, West Windsor, all of N.J.

[73] Assignee: RCA Corporation, New York, N.Y.

[21] Appl. No.: 961,471

[22] Filed: Nov. 16, 1978

[51] Int. Cl.³ .............................................. B01J 17/00
[52] U.S. Cl. ..................................... 29/577; 29/576 J; 29/580; 29/583
[58] Field of Search ............... 29/577, 580, 583, 576 J

[56] References Cited

U.S. PATENT DOCUMENTS

| | | | |
|---|---|---|---|
| 3,274,454 | 9/1966 | Haberecht | 29/576 J |
| 3,288,662 | 11/1966 | Weisberg | 29/580 |
| 3,897,627 | 8/1975 | Klatskin | 29/580 |

Primary Examiner—W. C. Tupman
Attorney, Agent, or Firm—H. Christoffersen; D. S. Cohen; K. R. Glick

[57] ABSTRACT

A semiconductor wafer is appropriately doped to create a P-N or P-I-N junction, and metallized on both its planar surfaces with electrode material. The wafer is then bonded to a second similarly processed wafer. Without damaging the semiconductor material, the stacked wafer is processed so as to delineate a plurality of diodes on each side of the center metallization, such that the diodes on each side are registered with each other. The center metallization is then cut so as to yield a plurality of stacked semiconductor diodes.

8 Claims, 5 Drawing Figures

METHOD FOR FABRICATING STACKED SEMICONDUCTOR DIODES FOR HIGH POWER/LOW LOSS APPLICATIONS

BACKGROUND OF THE INVENTION

The present invention relates to a method for batch fabricating stacked semiconductor diodes, and more particularly to the fabrication of stacked P-I-N or P-N diodes for high power/low loss applications.

Typically, multiple diodes are stacked in series to achieve higher power handling capability. This increase occurs because the breakdown voltage of the stacked diodes is essentially equal to the sum of the breakdown voltages of the individual diodes which comprise it. Furthermore, if the stack is comprised of P-I-N diodes, the stack will exhibit a resistive loss (or forward resistance) lower than that of an equivalent individual diode. This occurs because the total thickness of the I layer is distributed over a plurality of diodes in the stack rather than being entirely within a single diode.

For P-I-N diodes the forward resistance is the sum of the plasma resistance, diffusion resistance, contact resistance, and series resistance of the contact layers. However, since the magnitude of the plasma resistance is far more significant than the other resistance components, (particularly at frequencies above 100 MHz), the forward resistance can be approximated by merely considering the plasma resistance term alone. This yields $$R_F \simeq R_p = \frac{d^2}{I_F \mu \tau}$$

where $R_F$ is the forward resistance, $R_p$ is the plasma resistance, d is the I layer thickness, $I_F$ is the forward current, $\mu$ is the sum of the electron and hole mobilities, and $\tau$ is the effective carrier lifetime. In the stacked diode, the total $R_F$ is the sum of the $R_F$'s of the individual diodes in the stack. Since the $R_F$ of a diode is proportional to the square of its I layer thickness, the $R_F$ of a single diode of I layer thickness X is greater than the $R_F$ of a stacked diode comprised of N diodes of I layer thickness X/N.

Techniques for fabricating both individual and stacked diodes are known and used in the semiconductor industry. However, these existing techniques create difficulties when adapted to high power/low loss applications. Producing a stacked configuration from individually generated diodes requires that a bonding operation be performed on the individual diodes. This creates the need for a handling procedure to manipulate the typically small diodes, a potentially costly and inefficient operation.

To avoid these handling problems associated with a bonding operation performed on individual diodes, processes have been developed which include stacking the diodes while they are in wafer form. These techniques generally comprise the steps of semiconductor wafer doping and metallization, laminating the desired number of wafers together, pattern generating the diodes on the exposed wafer surfaces, dicing the wafer into laminated stacks, and performing a finishing operation on the diced surfaces of the stacks. The dicing of the laminated wafer is generally accomplished by mechanical cutting, since the laminations typically include layers of metal as well as semiconductor material. The mechanical cutting operation, however, causes damage to the cut semiconductor surfaces, and necessitates the performance of a surface finishing step. This surface finishing is typically performed by a chemical etch, and can be performed, for example, as described in U.S. Pat. No. 3,929,531, issued Dec. 30, 1975 to H. Hattori and Y. Takayama.

However, in the case of stacked diodes which are comprised of two P-I-N diodes, and are to be used in high power/low loss applications, this manufacturing technique is unsatisfactory. For high power/low loss applications, the damage caused to the semiconductor surfaces during the cutting operation cannot be adequately rectified by subsequent chemical surface finishing, as taught by the prior art. The present invention describes an efficient method for fabricating stacked diodes comprised of two diodes.

SUMMARY OF THE INVENTION

A semiconductor wafer is doped so as to create a P-N or P-I-N junction in its interior. The planar surfaces of the wafer are then metallized, and the wafer is concentrically stacked and bonded to a second similarly treated wafer. A plurality of electrode areas are then generated on both planar surfaces of the stacked wafer such that the electrode areas on each surface are registered with each other. Using the electrode areas as an etch mask, the semiconductor material on both sides of the stacked wafer is etched down to the metallization at the center of the stacked wafer. The wafer is then divided into a plurality of individual stacked diodes by breaking the exposed center metallization which separates them.

DETAILED DESCRIPTION

The method of the present invention can be applied to the fabrication of either stacked P-I-N or stacked P-N diodes. Furthermore, the orientation of the two diodes in the stack can be such that both have the same polarity or that both have opposite polarities. FIGS. 1—5 illustrate the invention in the embodiment of two P-I-N diodes oriented with the same polarity.

Figure 1:
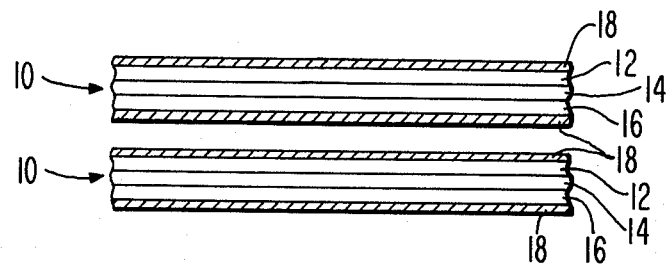
FIGS. 1—5 are simplified cross-sectional views of a preferred embodiment of the stacked diode fabrication sequence.

FIG. 1 depicts a cross-sectional view of two similarly doped and metallized semiconductor wafers 10. Each wafer is shown to have three conductivity regions; N type (12), I type (14), and P type (16). These three conductivity regions can be formed by standard doping procedures used throughout the semiconductor industry. On each wafer there is a metallized layer 18 which can, for example, be comprised of a 500Å layer of Cr deposited on the surface of the semiconductor, and a 10,000Å layer of Au deposited on the Cr layer. Both of these thin metal films can be applied by standard vacuum deposition techniques, such as evaporation or sputtering.

After both semiconductor wafers have been metallized, they are bonded together in the desired orientation. This bonding can be performed by soldering across the appropriate surface of each wafer, or by any other technique which will yield a continuous electrically conductive film interface between the two wafers.

Figure 2:
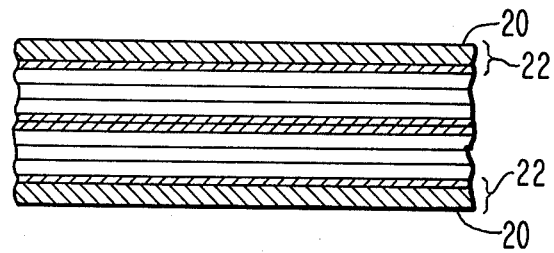

If a thicker metal film is desired on the outside surfaces of the stacked wafer, additional metallization 20 can be deposited by any known vacuum deposition or plating technique, so as to create an external metallization layer 22, as illustrated in FIG. 2.

Figure 3:
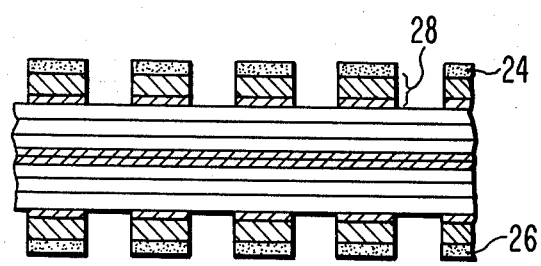

Photoresist patterns 24 and 26 are generated on both external metallization layers 22 such that the areas in which the photoresist remains correspond to the areas in which it is desired to locate diode electrodes. The areas of photoresist on both surfaces should be pattern generated such that they are in registration with each other. The external metallization 22 is then removed from those areas not covered by photoresist so as to create electrode areas 28, as illustrated in FIG. 3. This external metallization 22 can be removed, for example, by any appropriate combination of chemical etching solutions commonly used in the semiconductor industry.

Figure 4:
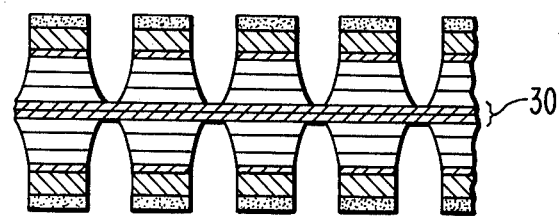

The semiconductor material is then removed from those areas of the stacked wafer which are not covered by the electrode areas 28 so as to expose the center metallization 30, as illustrated in FIG. 4. The semiconductor material can be removed by any technique which will not degrade the surface of the semiconductor material which remains. For example, if the semiconductor material is silicon of a 5-6 mil thickness, then it can be chemically etched by immersing the stacked wafer in a solution of 8% HF, 92% $HNO_3$ for 45-60 minutes.

The photoresist is then stripped from the surfaces of the electrode areas 28, by any commonly used technique, to yield an array of stacked diodes in the form of a wafer.

Figure 5:
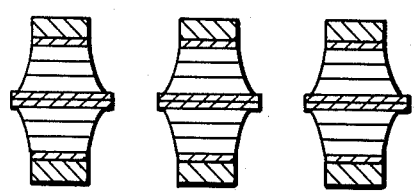

The array of stacked diodes is separated by breaking the center metallization 30 which connects them, to yield a plurality of individual stacked diodes as illustrated in FIG. 5. The center metallization 30 which separates each of the stacked diodes can be broken, for example, by mechanically cutting it. It should be observed that this mechanical cutting of the center metallization 30 will not be detrimental to the semiconductor portion of the diodes, since the semiconductor surfaces are not contacted by the cutting means. The cutting can be accomplished, for example, by shearing the center metallization 30 with a knife edge.

The process herein described presents several advantages over the existing methods of manufacturing stacked semiconductor diodes for high power/low loss applications. The stacked diodes fabricated by the present invention each consists of a precisely delineated diode which is laminated to, and shares an electrode with, a second precisely delineated diode.

Typical operating conditions require that each stacked diode be able to withstand 14 Kw peak power with 50$\mu$ sec pulses at a duty cycle of 0.2%. These conditions could perhaps be met by a stacked diode design taught in the prior art, where the stack consists of a plurality of diodes. However, a stack comprised of two diodes having the requisite electrical characteristics cannot be manufactured by any previously known technique, which requires wafer separation by mechanical cutting of the semiconductor material. This is because of the inability to adequately rectify the semiconductor degradation caused by the cutting operation; a result that was experimentally verified in the course of developing the present invention. Since the present invention does not require the semiconductor material to be mechanically cut, the semiconductor surface remains free of mechanically induced defects and is therefore not electrically degraded.

The advantages of the present invention derive from the two semiconductor wafers being bonded together early in the fabrication sequence, thus permitting the stacked wafer to be handled as a single unit in subsequent processing. To elaborate, the steps of applying additional metallization 20, delineating photoresist patterns 24 and 26, and chemically etching the semiconductor material, are each performed on both sides of the stacked wafer, and can be performed on both sides simultaneously.

Furthermore, it should be reemphasized that although a P-I-N/P-I-N embodiment is described herein, the invention is not so restricted. Other configurations are similarly possible, depending upon the doping of the wafers and the orientation of the doped wafers prior to bonding them together. For example, fabrication of P-I-N/N-I-P, N-I-P/P-I-N, P-N/P-N, P-N/N-P, or N-P/P-N stacked diodes are also described by the present invention.

What is claimed is:

1. A method for batch fabricating stacked semiconductor devices, wherein the stack consists of two diodes, comprising the steps of:
   (a) depositing a metallization layer on both planar surfaces of two appropriately doped semiconductor wafers;
   (b) bonding one wafer to the second wafer such that they form a stacked, concentric configuration with complete surface contact;
   (c) generating a plurality of electrode areas on both planar surfaces of the stacked wafer, such that the electrode areas on each surface are registered with each other;
   (d) etching through the semiconductor material on both sides of the stacked wafer, using the electrode areas as an etch mask, such that the metallization layer at the center of the stack is exposed; and,
   (e) separating the stacked wafer along the exposed center metallization boundaries, so as to create a plurality of stacked semiconductor devices.

2. A method in accordance with claim 1, wherein the bonding is accomplished by soldering across the entire interface between the two wafers.

3. A method in accordance with claim 1, wherein prior to metallization, each of the semiconductor wafers is doped so as to create a surface layer of N-type conductivity, an opposite surface layer of P-type conductivity, and a P-N junction in the interior of the wafer, at the interface of the two surface layers.

4. A method in accordance with claim 1, wherein prior to metallization, each of the semiconductor wafers is doped so as to create a P-I-N junction, with a surface layer of N-type conductivity, an opposite surface layer of P-type conductivity, and an intermediate layer of intrinsic semiconductor.

5. A method in accordance with claim 1, wherein the metallization layer is comprised of a gold thin film overlying a chromium thin film.

6. A method in accordance with claim 5 wherein after bonding the two wafers, additional gold metallization is deposited on the gold thin film layer which covers each surface of the stacked wafer.

7. A method in accordance with claims 1 or 6, wherein the electrode areas are delineated by generating a photoresist pattern on the metallization on each surface of the stacked wafer; removing the metallization from the areas which are not covered by photoresist; and, removing the photoresist.

8. A method in accordance with claim 7, wherein the steps of generating the photoresist pattern, removing the metallization, and removing the photoresist, are performed on both surfaces simultaneously.

* * * * *